(12) United States Patent
Witvrouw et al.

(10) Patent No.: US 7,803,665 B2
(45) Date of Patent: Sep. 28, 2010

(54) METHOD FOR ENCAPSULATING A DEVICE IN A MICROCAVITY

(75) Inventors: Ann Witvrouw, Herent (BE); Chris Van Hoof, Leuven (BE); Raquel Consuelo Hellin Rico, Elda (Alicante) (ES); Anthony Joseph Muscat, Tucson, AZ (US); Jan Fransaer, Leefdaal (BE); Jean-Pierre Celis, Korbeek-Lo (BE)

(73) Assignees: IMEC, Leuven (BE); Katholieke Universiteit Leuven, K.U. Leuven R&D, Lueven (BE)

( * ) Notice: Subject to any disclaimer, the term of this patent is extended or adjusted under 35 U.S.C. 154(b) by 0 days.

(21) Appl. No.: 11/814,724

(22) PCT Filed: Feb. 6, 2006

(86) PCT No.: PCT/BE2006/000007

§ 371 (c)(1),
(2), (4) Date: Jul. 25, 2007

(87) PCT Pub. No.: WO2006/081636

PCT Pub. Date: Aug. 10, 2006

(65) Prior Publication Data

US 2008/0135998 A1    Jun. 12, 2008

Related U.S. Application Data

(60) Provisional application No. 60/650,638, filed on Feb. 4, 2005.

(51) Int. Cl.
  *H01L 23/28* (2006.01)
  *H01L 21/31* (2006.01)
(52) U.S. Cl. .............. 438/124; 257/E21.502; 257/E23.116; 438/50; 438/52

(58) Field of Classification Search ............... 257/678, 257/E21.502, E23.18, E23.166, 787, E23.116; 438/124, 127, 50, 52
See application file for complete search history.

(56) References Cited

U.S. PATENT DOCUMENTS 6,635,509 B1 * 10/2003 Ouellet ................. 438/106

(Continued)

OTHER PUBLICATIONS

Pugh et al., "Formation of nanoporous platinum by selective dissolution of Cu from Cu0.75Pt0.25." Materials Research Society vol. 18, No. 1 (2003): pp. 216-221.*

(Continued)

*Primary Examiner*—Matthew Smith
*Assistant Examiner*—Michele Fan
(74) *Attorney, Agent, or Firm*—McDonnell Boehnen Hulbert & Berghoff LLP

(57) ABSTRACT

Manufacturing a semiconductor device involves forming (200) a sacrificial layer where a micro cavity is to be located, forming (210) a metal layer of thickness greater than 1 micron over the sacrificial layer, forming (220) a porous layer from the metal layer, the porous layer having pores of length greater than ten times their breadth, and having a breadth in the range 10 nm-500 nanometers. The pores can be created by anodising, electrodeposition or dealloying. Then the sacrificial layer can be removed (230) through the porous layer, to form the micro cavity, and pores can be sealed (240). Encapsulating MEMS devices with a porous layer can reduce costs by avoiding using photolithography for shaping the access holes since the sacrificial layer is removed through the porous membrane.

5 Claims, 6 Drawing Sheets

U.S. PATENT DOCUMENTS

| | | | |
|---|---|---|---|
| 7,427,526 | B2* | 9/2008 | Fonash et al. ............... 438/33 |
| 2001/0004085 | A1* | 6/2001 | Gueissaz ............... 228/124.6 |
| 2003/0183916 | A1 | 10/2003 | Heck et al. |
| 2004/0040416 | A1* | 3/2004 | Erlebacher et al. ............ 75/345 |
| 2004/0166606 | A1 | 8/2004 | Forehand |
| 2004/0219706 | A1* | 11/2004 | Wan ............................. 438/53 |
| 2004/0224091 | A1 | 11/2004 | Rusu et al. |
| 2004/0245586 | A1 | 12/2004 | Partridge et al. |

OTHER PUBLICATIONS

Denison et al., "The Use of 'Dry' CO2-based Technologies for the Enhanced Fabrication of Microelectronic Devices." American Chemical Society (2004).*

He, Rihui et al., "Porous Polysilicon Shell Formed by Electrochemical Etching for On-Chip Vacuum Encapsulation," Solid-State Sensor, Actuator and Microsystems Workshop, Hilton Head Island, SC, Jun. 6-10, 2004, at 332-335.

Tang, Fengqiu et al., "Electrophoretic Deposition Behavior of Aqueous Nanosized Zinc Oxide Suspensions", J. Am. Ceram. Soc., vol. 85, No. 9, pp. 2161-2165 (2002).

"Prevention of Corrosion in Structural Aluminum Alloys", http://www.public.asu.edu/~karls/Corrosion.html, pp. 1-4.

Das, B. et al., "Porous Silicon PN Junction Light Emitting Diodes", Semicond. Sci. Technol., vol. 14, pp. 988-993 (1999).

Ji, Chunxin et al., "Fabrication of Nanoporous Gold Nanowires", Applied Physics Letters, vol. 81, No. 23, pp. 4437-4439 (Dec. 2, 2002).

Li, A.P. et al., "Hexagonal Pore Arrays With a 50-420 nm Interpore Distance Formed by Self-Organization in Anodic Alumina", Journal of Applied Physics, vol. 84, No. 11, pp. 6023-6026 (Dec. 1, 1998).

Sulka, Grzegorz, "Electrochemical Nanostructuring of Aluminium Based on Anodising and a Consecutive Electroplating of Magnetic Material into the Pores", http://www.mtm.kuleuven.ac.be/Research/SURF/webgs.htm, pp. 1-3.

Put, S. et al., "Electrophoretic Shaping of Functionally Graded Hardmetals", P/M Science & Technology Briefs, vol. 3, No. 3, pp. 14-17 (2001).

Sieradzki, Karl, "Curvature Effects in Alloy Dissolution", J. Electrochem. Soc. vol. 140, No. 10, pp. 2868-2872 (Oct. 1993).

* cited by examiner

METHOD FOR ENCAPSULATING A DEVICE IN A MICROCAVITY

FIELD OF THE INVENTION

The present invention is related to methods of manufacturing semiconductor devices, (especially to methods of encapsulation) and to such devices. Particular embodiments relate to microelectronic process technology, to Micro- and Nano-Electro Mechanical Systems (MEMS and NEMS) process and encapsulation or packaging technology, to methods for the 0-Level or wafer level packaging or encapsulation objects for instance MEMS devices. Such encapsulation can cause a cavity, in which an object can be located, such as to be hermetically sealed.

BACKGROUND

Many micro-electromechanical systems (MEMS) require an encapsulation under vacuum or under a controlled atmosphere and pressure in order to ensure either a good performance or an acceptable lifetime of operation. The encapsulation has to be performed without the deposition of sealing material on the MEMS device, which can cause damage to the device.

The most popular approach is based on wafer bonding. Here, the sealing is performed by connecting two wafers (device wafer and capping wafer) together by means of a reflowable material.

Alternatively, encapsulation can be done by the fabrication and sealing of surface micro-machined membranes. The use of conformal LPCVD (low-pressure chemical vapor deposition) films is a known method for encapsulation at low pressure. The sealing of the cavity comprising the MEMS devices is done while depositing the conformal film. Hence, the atmosphere and pressure of the sealed MEMS device are those of the deposition chamber. Methods for sealing at higher pressures up to the order of atmospheric pressure and a few times that value, by the deposition of thin films, are however not widespread. Moreover, most of these atmospheric pressure techniques do not prevent material deposition inside the cavity. MEMS devices can be very fragile and deposition of material on the device is preferably avoided.

The openings which are typically produced in the sealing membrane using current approaches, have been etched, and are therefore sometimes quite large. Etching openings moreover requires patterning, masking steps etc which complicate the whole process of encapsulation. Such openings are provided mostly for allowing a sacrificial material etchant to reach out below the membrane or film, which had been supported temporarily by a sacrificial material, hereby dissolving or removing the sacrificial material and releasing the film, at least locally. The use of such a sacrificial material is state of the art when producing overhanging structures in packaging and MEMS processing technology.

There is a need for zero-level or wafer level packaging solutions which simplify the state of the art process sequences, and which moreover reduce the risk of having sealing material penetrating the area under the sealing membrane as for instance a cavity comprising for instance a fragile object as for instance a MEMS device.

It is known from US20040166606 to provide a structural material deposited on top of the sacrificial layer of a MEMS structure. It can be insulator or conductor and should have sufficient structural integrity so as to support the subsequent application of a liquid encapsulating material. It may be between 0.2-20 microns thick and has open regions to make a cage structure. These open regions are formed by removing material from the structural layer by sputtering, plasma etching, or wet etching. The size and spacing of the apertures should be large enough and/or spaced close enough such that the sacrificial layer can be later removed, but the apertures should be small enough as to not allow the protective material, such as Spin-On Glass (SOG), to encroach into the cavity and contact the movable structure. In addition, there should remain sufficient material to be structurally strong enough to not collapse upon application of the protective, encapsulating material. The sacrificial layer is then removed to create a microcavity in the space between the cage and the MEMS or micromachined device, using any of sublimation, sputter etching, ion beam milling, plasma etching or use of wet chemicals. Then the appropriate protective material is applied to encapsulate the MEMS device.

It is known from US2004/0224091 to provide sealing of a MEMS cavity by a nickel cap with pores which are sealed by reflow of Indium after removal of the sacrificial layer.

It is shown in US20040245586 to use various materials to encapsulate a MEMS structure, for example, silicon (polycrystalline, amorphous or porous, whether doped or undoped), silicon carbide, silicon-germanium, germanium, or gallium-arsenide.

SUMMARY OF THE INVENTION

An object of the invention is to provide improved methods of manufacturing semiconductor devices, (especially to methods of encapsulation) and to such devices. A further object is to provide microelectronic process technology, Micro- and Nano-Electro Mechanical Systems (MEMS and NEMS) process and encapsulation or packaging technology, methods for the zero-Level or wafer level packaging or encapsulation objects for instance MEMS devices. Such encapsulation can cause a cavity, in which an object can be located, such as to be hermetically sealed.

According to an aspect of the invention there is provided:

A method of manufacturing a semiconductor device having the steps of:

forming a sacrificial layer where a micro cavity is to be located, forming a metal layer of thickness greater than 1 micron over the sacrificial layer, forming a porous layer from the metal layer, the porous layer having pores of length greater than ten times their breadth, and having a breadth in the range 10-500 nm, e.g. 300 nm or between 300 nm and 500 nm, or between 10 and 300 nm, removing at least some of the sacrificial layer through the porous layer, to form the micro cavity, and sealing the pores.

Metal is defined as excluding silicon, e.g. a metal has a resistivity less than $10^{-5}$ ohm·cm at 300° K., e.g. between to $10^{-6}$ ohm·cm at 300° K. Porous silicon has the disadvantage that it is formed by etching with HF. HF can attack the device inside that cavity, if this is also Si-based material.

Some advantages of the present invention are:

a) The temperature budget is low. Metal can be deposited at low temperature. A resist step is not required which avoids resist baking. So temperatures during manufacture can be kept to less than 200° C., or even less than 150° C. This is particularly important where the encapsulation is over a cavity for a sensitive part such as a MEMS component whose characteristics should not change.

b) Good mechanical properties, e.g. better than silicon, e.g. better than a modulus E of 107 GPa (for silicon) or 86 GPa (for porous silicon), for example a modulus better than 150 or 200 GPa such as a modulus of 390 GPa for $Al_2O_3$ or a modulus of 315.9 GPa for $Al_2O_3$ with 10% porosity.

c) No need for corrosive chemicals, such as HF.

d) Can make either insulating or conductive caps.

e) Can be made with reduced manufacturing complexity by avoiding lithography.

f) The porous layer can enable removal of the sacrificial layer yet provide more protection against inadvertent contamination of the micro cavity than is provided by conventional etched apertures in metal. This is because the pores can provide more resistance to gravitation driven flow of particles or fluids during sealing or other intermediate steps before sealing, during manufacture. Thus yield or reliability can be increased for devices having sensitive components in the micro cavity.

If compared to a conventional capping layer where holes are formed by a lithographic step, avoiding a lithographic step is less expensive and is less time consuming. Moreover, the holes conventionally made using lithography are quite "large", e.g. about 2 micron as making smaller holes by litho is expensive. Thus, during the step of forming the sealing layer, material can fall into the cavity.

In contrast, the porous layer claimed can form a capping layer that has good mechanical properties and that has small holes (between 10 nm and a few micrometer compared to litho) and can be formed by steps which don't harm a sensitive device such as a MEMS device inside the cavity.

Additional features of some embodiments include the metal layer comprising an alloy of metals having differing etch rates, and the step of forming the porous layer comprising etching the deposited alloy to remove the metal having the faster etch rate. Another such additional feature is the etching step comprising any one or more of: electrochemical etching and chemical etching using an oxidizer and chelator diluted in a supercritical fluid.

Another such additional feature is the step of forming the porous layer having the steps of forming a colloidal template and carrying out electrodeposition of metal on the colloidal template.

Other additional features are forming the porous layer having the step of anodization of the metal layer, the metal layer comprising Al of thickness less than 4 µm, and the anodization being carried out with a potential difference in a range 10-25V, in an electrolyte of 20 wt % sulphuric acid.

Other additional features include (1) the pores extending indirectly through the porous layer via junctions or curves, instead of through a line-of-sight connection (2) the step of sealing having the step of forming a sealing layer over the porous layer, and (3) the method being used to form a semiconductor device comprising any of (a) a MEMS or NEMS device, (b) a micro accelerometer, (c) a micro gyroscope, (d) micro tube, (e) vibration micro sensor, (f) micro mirror, (g) micro mechanical resonator, (h) resonant strain gauges, (i) micro mechanical filter, (j) micro switch, (k) micro electrical circuit, (l) micro relay, and (m) an integrated circuit with air gap.

Another aspect provides a semiconductor device having a micro cavity covered by a metallic porous layer, the porous layer having pores of length greater than ten times their breadth, and having a breadth in the range 10-500 nanometers, e.g. 300 nm or between 300 and 500 nm, or between 10 and 300 nm, and a sealing layer sealing the pores.

An additional feature is the porous layer comprising anodized Al.

An additional feature is the porous layer having a thickness of less than 4 µm.

An additional feature is the semiconductor device comprising any of a MEMS or NEMS device, a micro accelerometer, a micro gyroscope, micro tube, vibration micro sensor, micro mirror, micro mechanical resonator, resonant strain gauges, micro mechanical filter, micro switch, micro electrical circuit, micro relay, and an integrated circuit with air gap.

Another additional feature is the porous layer having a surface density of pores being any of: higher than $10^9$ pores/$cm^2$, or higher than $10^{10}$ pores/$cm^2$ or higher than $10^{11}$ pores/$cm^2$.

Any of the additional features can be combined together and combined with any of the aspects. Other advantages will be apparent to those skilled in the art, especially over other prior art. Numerous variations and modifications can be made without departing from the claims of the present invention. Therefore, it should be clearly understood that the form of the present invention is illustrative only and is not intended to limit the scope of the claims of the present invention.

BRIEF DESCRIPTION OF THE DRAWINGS

How the present invention may be put into effect will now be described by way of example with reference to the appended drawings, in which.

DETAILED DESCRIPTION

Figure 1:
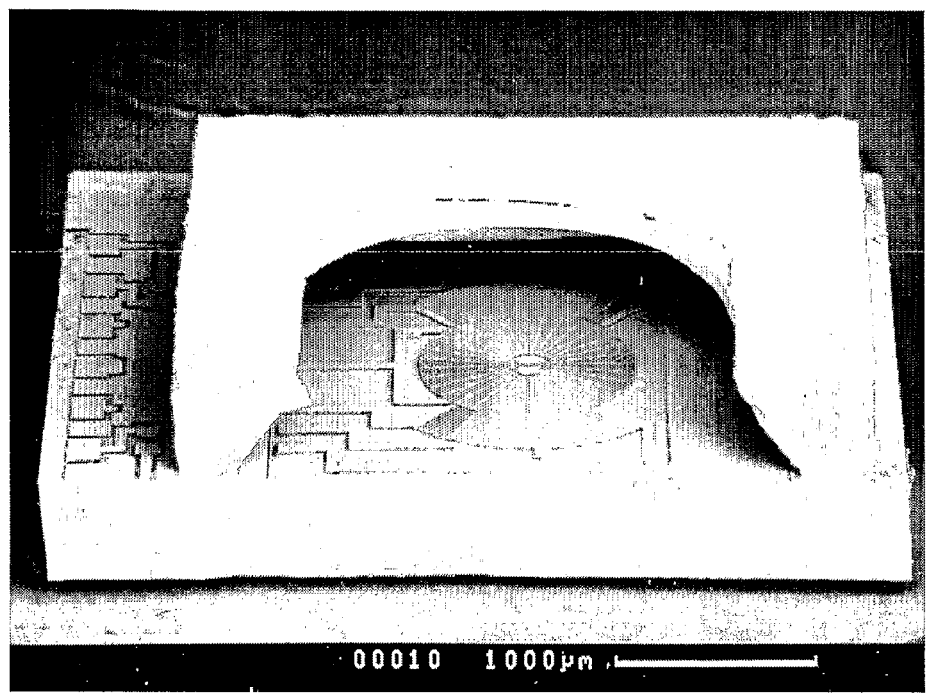
FIG. 1 shows a cross section through an encapsulated MEMS gyroscope (source: R. Bosch GmbH)

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Moreover, the terms top, bottom, over, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

For the purpose of this disclosure, a MEMS or NEMS device can be any state of the art device. Examples of such devices are micro accelerometers, micro gyroscopes, micro tubes, vibration micro sensors, micro mirrors, micro mechanical resonators or "resonant strain gauges", micro mechanical filters, micro switches, micro electrical circuits, micro relays, Integrated Circuits with air gaps etc.

Also for the purpose of this disclosure, when referring to a more noble material of 2 materials, it is meant that material that is the least etchable or sensitive to a certain etchant. It is thus a relative concept.

A method for removing a sacrificial material under a membrane is disclosed, the method comprising the steps of:
a. providing a layer of sacrificial material;
b. providing said membrane directly on top of said sacrificial layer, said membrane having a front main surface and a back main surface, (e.g. the membrane can comprise different sublayers);
c. making said membrane porous such that pores and/or holes (e.g. holes can be a set of sub-surface interconnected pores) are created which extend from said front main surface towards the second main surface;
d. applying a sacrificial material etchant on said first surface until said sacrificial material is at least partially removed by said sacrificial material etchant.

In certain embodiments the sacrificial material is filling a cavity which is present under said membrane. The cavity can further comprise a MEMS or NEMS device, the functioning and structure of which is inert to said sacrificial material etchant. It can comprise a fragile object, on which substantially no material may be deposited during the closure process to guarantee the proper working and lifetime of the device.

In certain embodiments the cavity is closed except for said pores and optionally a vent hole. A vent hole is an additional hole which connects the cavity with the outside.

In one embodiment the pore openings are smaller then 1 micron, 0.5 micron, 0.1 micron or 0.01 micron in diameter.

In other embodiments the pores are not straight, i.e. they make an angle different from 0 with respect to the direction of the gravity force when the substrate is placed in a horizontal plane.

This can be substantially absolute or statistically speaking; with the latter expressing "statistically" is meant that a major fraction of the pores fulfil that requirement, e.g. a fraction of 99%, 95%, 90%, 80%, 50%. Smaller fraction may also be advantageous but to a lesser extent.

This is a difference with the prior art solutions where holes are etched in the membrane. Because of the lithography steps in the prior art, only straight holes or pores can be produced, which are moreover vertical. Such pores will moreover not interconnect. In some embodiments substantially all pores have a parallel direction, which is forming an angle different from zero with respect to the direction of the gravity force.

In some embodiments the pores/holes make angles which are distributed in the range of 0 to 180 degrees with respect to the front main surface and the back main surface, where 0 and 180 degrees are parallel to the main surfaces and 90 degrees is perpendicular to the main surfaces.

Having pores which are not straight may be advantageous because the sacrificial material etchant can penetrate into the pores and through the membrane (in both directions), and at the same time the risk of having sealing material entering the underlying cavity of the membrane in a later step is removed or at least reduced.

In still other embodiments, the holes/pores are sub-surface interconnected, which means that they can have different angles with respect to each other or can have non constant or randomly varying angles. The interconnection of the holes/pores brings an additional advantage of preventing sealing material from passing through the membrane when applied in a later step.

In certain embodiments of methods the resulting surface density of pores at the surface is higher than $10^9$ pores/cm$^2$, or higher than $10^{10}$ pores/cm$^2$ or higher than $10^{11}$ pores/cm$^2$. The densities can be higher than densities which are currently achievable with photolithographic techniques.

A method is disclosed that further comprises a step of removing said sacrificial material etchant from said cavity via through the permeable membrane, and/or optionally via said venthole, in certain embodiments of those when present. This can be achieved by state of the art techniques; they can comprise for instance the introduction of pressure differences, controlled heating, controlled shaking, gas flow, suction.

An additional step of closing said pores by depositing a sealing layer after having removed said sacrificial material and sacrificial material etchant is foreseen in certain embodiments.

This can be performed by depositing a sealing or in certain cases a reflow material on the front surface of the membrane.

In the case where a reflow material is applied, the reflow is performed at a temperature lower than the melting temperature of the substrate, the melting temperature of said layer or film, and a critical temperature of the device inside the cavity. A reflow step can cause a flat topology of the reflow layer. Such a flat topology can be interesting for further processing steps.

In further embodiments, a further step is comprised in which the closing of the vent hole is performed under controlled atmosphere and pressure conditions, which can be different from the deposition conditions of the sealing layer.

The cavity can comprise a fragile device on which substantially no material may be deposited during the closure process to guarantee the proper working and lifetime of the device.

In certain embodiments the film comprises pores located above different cavities in a substrate. Here different cavities can be sealed/processed at the same time.

The sealing layer can, for instance, comprise aluminum, germanium, silicon germanium.

The sealing layer may be deposited by an evaporation technique or a chemical or physical vapour deposition technique. In one embodiment, the reflow or sealing layer may be a conductive layer. The reflow or sealing layer may be planarized during or after reflow. In one embodiment the reflow or sealing layer may comprise aluminum. In a further embodiment, the reflow or sealing layer may comprise germanium.

In a certain methods, reflow may be performed at a temperature lower than at least one of the following:
the melting temperature of the substrate,
the melting temperature of the intermediate layer,
the melting temperature of the wetting layer and
a critical temperature of the device inside the cavity.

The cavity may be sealed under controlled atmosphere and pressure by closing the vent hole under a second set of atmosphere and pressure conditions, after that the pores are closed. The pressure during the step of closing the pores, holes or vent holes may essentially be atmospheric pressure.

In other embodiments, the layer or film comprises pores above different cavities. Such techniques may allow the openings to be closed simultaneously.

Such methods may be advantageously used in a batch process.

These and other characteristics, features and advantages of embodiments of the present invention will become apparent from the following more detailed description, taken in conjunction with the accompanying drawings. This description is given for the sake of example only, without limiting the scope of the claims. The reference figures quoted below refer to the attached drawings.

As shown above, different aspects can in different ways contribute to improvements of the state of the art. Some but not all of those aspects are now summarized; smaller holes/pores play a role in improving the mechanical properties of the capping layer and reducing production costs. Using pores that are not straight and pores that are interconnected plays a role in preventing sealing material from passing through the membrane. Thus, the structure/topology of the holes/pores contributes to the advantages of the invention.

When in the description or in the claims the term 'a controlled atmosphere' is used, a controlled constitution of ambient gas is meant. The notion of 'horizontal' is defined as substantially orthogonal to the direction of a gravitational field, for example the earth's gravitational field.

For the purpose of this disclosure, the notion of 'essentially no material passing through the openings' should be understood as 'no or only a limited amount of material passing in and/or through the openings'. In the context of sealing of a cavity that comprises a fragile device, it should be such that the proper working of the device is not affected by the limited amount of material that may pass.

Figure 3:
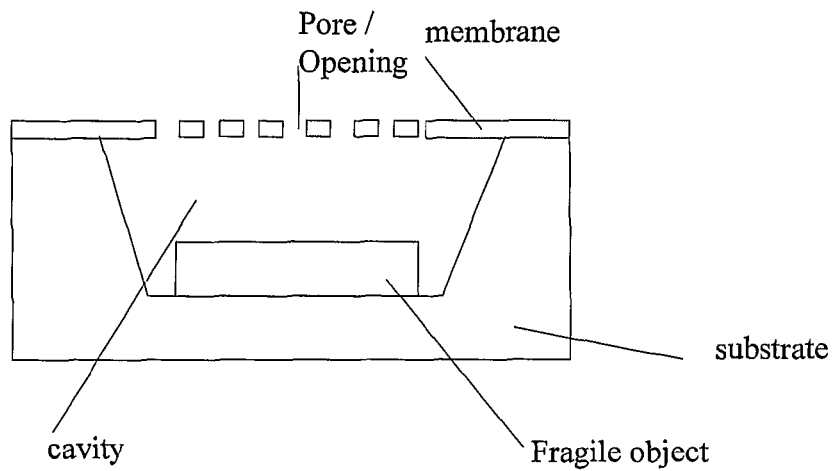
FIG. 3 shows an example of a porous layer.
Figure 4:
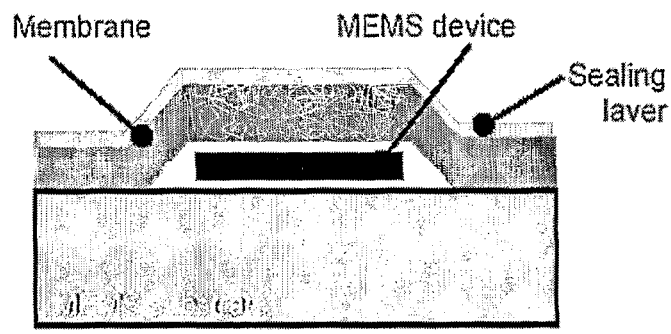
FIG. 4 shows an example of a porous layer covered by a sealing layer for encapsulating a MEMS device.
Figure 5:
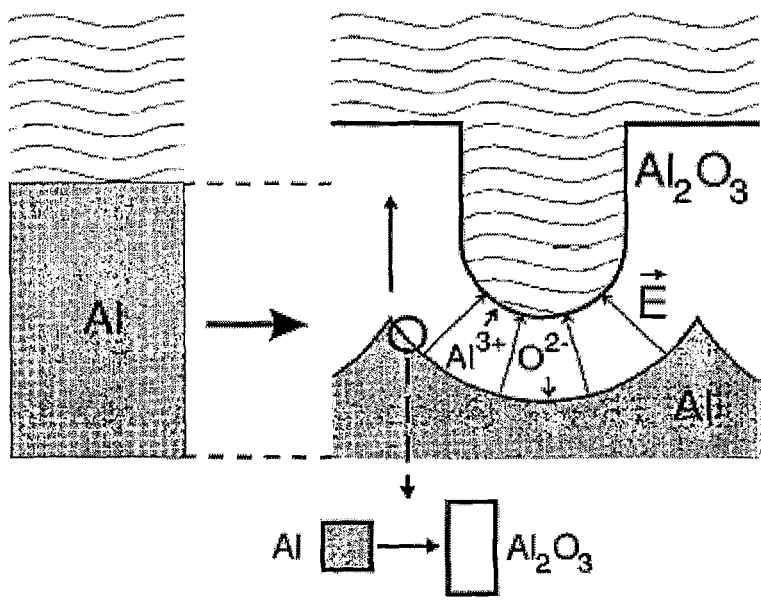
FIG. 5 shows a metal layer in the process of anodization.

An illustration of an example of a device, located in a cavity in a substrate, on which an improved method may be applied, is shown in FIG. 3. The substrate and the film or membrane layer may be any substrate and film or membrane layer used in MEMS processing. Examples of substrates, which may be used are, for example, single crystal or polycrystalline Si, single crystal or poly-crystalline Ge, glass, quartz, polymer, etc. Examples of suitable materials to form the film or membrane layer are polycrystalline SiGe, metal or metal alloy films, oxide-based or nitride-based films, polymer, single crystal or polycrystalline Si, etc. The material of the film or membrane layer may be conducting, insulating, semiconducting, etc. Furthermore, the fragile device located in the cavity, may be any MEMS device requiring a vacuum or controlled atmosphere and pressure encapsulation.

Sealing the openings in the film or membrane layer may influence the atmosphere and pressure of the cavity.

In a certain embodiment, a layer of a sealing material, also called a sealing layer, or in some cases a reflow layer, is deposited on top of the film or membrane layer that comprises openings/pores, until the openings/pores are reduced in diameter up to being completely sealed or almost completely sealed. In the latter case this layer is preferably thin enough such that no actual closing of the cavity occurs. The thickness of the sealing layer may depend on the deposition parameters and the deposition technique that has been used. The deposition of the sealing layer may be performed under optimal conditions or parameters for deposition. Deposition parameters may for example be pressure, gas flow and any relevant deposition parameter. The material of the sealing layer can be reflowed in a furnace with controlled atmosphere and pressure such that its surface is flattened. The reflow layer or sealing layer can act as a functional layer of the device itself or of other devices.

A reflow or sealing layer may be deposited. Any suitable material that can be deposited at a temperature below the critical temperature of the whole device may be used. Suitable deposition techniques for the sealing layer may for example be Physical or Chemical Vapor Deposition or evaporation. The sealing layer may, in this embodiment, for example be a metal (e.g. Ti, Ta, W, Al, Cu, Cr etc.), alloys, eutectic alloys, semiconductor materials (e.g. Si, Ge) or solder materials (e.g. SnPb, In, Bi, etc).

The atmosphere and the pressure inside the furnace when closing the venthole and/or holes/pores can be used to determine the final pressure and atmosphere inside the cavity. Possible atmospheres are, for example, inert gasses such as He or Ar, nitrogen or other gasses such as oxygen. The pressure may preferably be any pressure between vacuum pressure (e.g. 10E-6 mbar) and a few times atmospheric pressure. More preferably, the pressure may be a pressure between vacuum pressure and 2 atm. Even more preferably, the pressure may be a pressure between vacuum pressure and 1.2 atm. It is to be understood that although preferred embodiments, specific constructions and configurations, as well as materials, have been discussed herein, various changes or modifications in form and detail may be made without departing from the scope and spirit of this invention.

Figure 2:
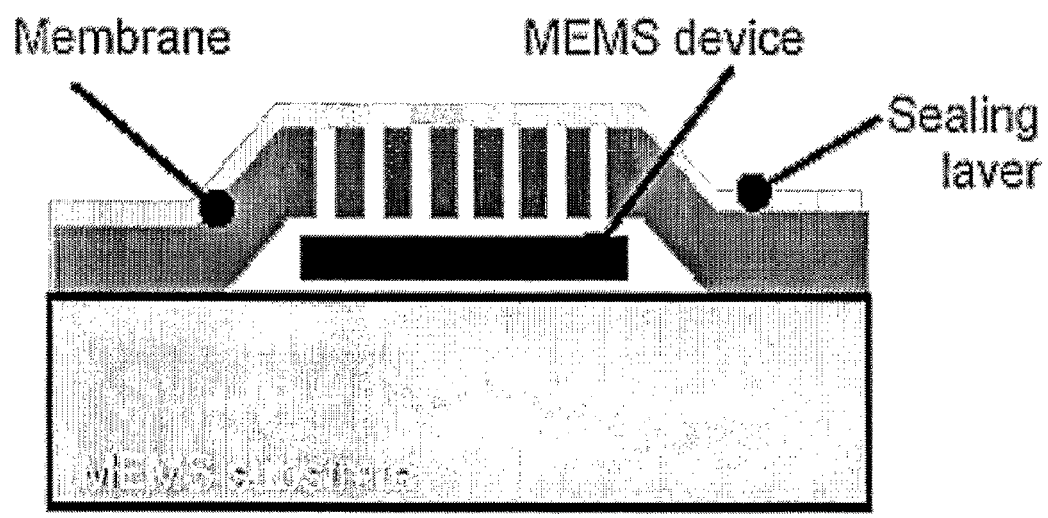
FIG. 2 shows a schematic view of a MEMS device encapsulated with a porous membrane.

MEMS are miniature systems with both electrical and non-electrical (e.g. mechanical) functionalities. Examples of MEMS devices are inkjet printer heads, miniature mechanical switches, and sensors for applications that include accelerometers (e.g. for air bags in cars) and gyroscopes (e.g. for roll-over detection in cars). MEMS structures are often free-standing and fragile so they must be encapsulated at the wafer level (so-called zero-level packaging) to avoid damage during wafer dicing and in use. Zero-level packaging is traditionally accomplished by bonding capping dies or a capping wafer to the wafer with the MEMS structures (FIG. 1). Alternatively surface micro-machining can be used to process a thin film membrane above the MEMS device. After etching of the sacrificial layer under and above the device to release it, the membrane is sealed to enclose the required atmosphere at a desired pressure in the cavity (FIG. 2). One advantage of this approach is that it reduces the thickness and area of the packaged device compared to the traditional approach.

In one embodiment, a MEMS device is encapsulated with a permeable membrane fabricated using supercritical $CO_2$. The membrane may be strong and/or resilient. Porosity facilitates manufacturing by avoiding lithographic steps required to shape the membrane and by providing a pathway to the outside through which to release the final structure. Instead of cutting straight access holes through the membrane as shown in FIG. 2, one approach is to make the membrane permeable with channels that are not line of sight. This will also facilitate sealing since narrow, indirect pores are more easily blocked after the release step, than micron-sized, straight holes made using conventional plasma etching. The porous membrane will be made in a two-step process. First a metal alloy consisting of two components is deposited on the release layer of a MEMS device. One component of the alloy is more reactive (less noble) than the other or less reactive (more noble) component. For example, Cu—Ag, Ni—Cu, and Ag—Au alloys illustrate possible combinations. The more reactive metal will be etched selectively using a chelator dissolved in supercritical $CO_2$ ($scCO_2$), yielding a porous membrane containing the more noble metal. The MEMS device will be released by removing the sacrificial layer through the pores in the membrane using a $scCO_2$ solution, and the pores will be subsequently sealed yielding the packaged device, which can be diced and plastic packaged or flip-chipped onto a board. Several alloys will be deposited by electroplating. In view of the subsequent dealloying step, alloys will be deposited that are fully miscible such as Ni—Cu and Ag—Au. In a first step, these alloys will be deposited from aqueous solutions. This limits the strength of the porous membrane as the most noble metal in miscible alloys that can be plated from aqueous solutions usually has a lower E-modulus.

Therefore, alloys will be deposited in a later stage from ionic liquids, appreciably widening the number of metal-metal combinations that can be deposited.

The size of the pores in the membrane using supercritical $CO_2$ is determined by the atomic order of the metal constituents and by their relative oxidation rates (since the chelator attacks only oxidized metal atoms), and not by mass transport and diffusion, which dominate conventional dealloying processes that occur in aqueous media. A low surface tension allows $scCO_2$ to wet any surface and penetrate features in the nanometer range. With a density comparable to a liquid and a diffusivity comparable to a gas, $scCO_2$ has the kinetic and mass transport properties required for short time scale processes. Separation and recycle can be accomplished by dropping the pressure, which reduces the environmental impact.

Different techniques can be thus be used in order to produce a porous membrane, some of which are already disclosed;
  in certain embodiments the membrane is a silicon membrane which can be made porous by using an HF etch.
  Any state of the art method can be used which is compatible with the rest of the processing.
  in some embodiments the following is happening;

electrodeposition of porous films by electrodeposition of metal in porous templates consisting of either a liquid crystalline phase or a close-packed array of colloidal particles. The liquid crystalline phase produces materials with regular arrays of pores in the 2-10 nm size range with typical wall thicknesses of the same size. These phases are formed by mixing together high concentrations of surfactants and water and have well-defined and characterized structures which depend on the temperature and the composition of the mixture. By dissolving an appropriate metal salt in the aqueous phase, metal can be deposited from the aqueous phase around the surfactant micelles, forming a porous structure.

The colloidal templates produce materials with close-packed arrays of interconnected pores with diameters that can be varied from around 20 nm to over 1 micron. The porous metal is formed by electrodeposition of metal around a colloidal assembly of particle on an electrode. After removal of the colloidal particles, a porous metal is left behind.

For some MEMS applications, porous thin membranes can be of a great solution to avoid the expensive step in common packages as photolithography is. Porous membranes can be fabricated by using aluminum anodizing (i), electrophoretic deposition and sintering (ii), and dealloying (iii). These alternatives will be described in more detail now. In principal, they can be combined to provide multiple layers of porous membranes.

Aluminum Anodization

A technique to get porous materials (i.e. materials like Si, GaN, SiC, Ti and its alloys, Mg, Nb, . . . [1-) in accordance with an embodiment of the present invention is wet electrochemical processing, namely anodizing. This technique has been used to get porous aluminum. The quality of the aluminum substrates and their surface pre-treatment has a large influence on the film structure formed by electrochemical processing.

Pores grow perpendicular to the surface when the field-enhanced oxide dissolution at the oxide/electrolyte interface and the oxide growth at the metal/oxide interface are in equilibrium. While the latter is due to the migration of oxygen containing ions ($O^{2-}/OH^-$) from the electrolyte through the oxide layer at the pore bottom, $Al^{3+}$ ions that simultaneously drift through the oxide layer are ejected into the solution at the oxide/electrolyte interface. The fact that $Al^{3+}$ ions are lost to the electrolyte has been shown to be a prerequisite for porous oxide growth, whereas $Al^{3+}$ ions, which reach the oxide/electrolyte interface, contribute to oxide formation in the case of barrier oxide growth. The atomic density of aluminum in alumina is by a factor of two lower than in metallic aluminum. Since the oxidation takes place at the entire pore bottom simultaneously, the material can only expand in the vertical direction, so that the existing pore walls are pushed upwards. As a result, the expansion of aluminum during oxidation leads to less than twice the original volume, but strongly depends on experimental conditions like the electrolyte concentration or anodizing voltage.

In a one-step anodizing process in which sulphuric acid is the electrolyte, the pores on the surface are distributed randomly when a low voltage is applied and ordered domains do not appear at the surface at all. Moreover, the size of the pores is not uniform. On the other hand, ordered domains with a rather larger inter-pore distance are observed by using much higher voltages and phosphoric acid solution as electrolyte [2]. Although the anodic process is very stable under a low voltage, the pore arrangements become more disordered with decreasing voltage since the volume expansion factors become smaller [2].

In a two-step anodizing process, the first short anodizing step patterns the surface of the aluminum foil. Later, this patterned surface acts as self-assembled marks for the second anodizing step [3]. An extended second anodizing step, after etching away the first anodized layer not only improves the regularity of the cell arrangement but also reduces the number of defects and dislocations. A third anodizing step does not significantly improve the ordering of the pores and the size of the well-ordered domains [3].

Figure 6:
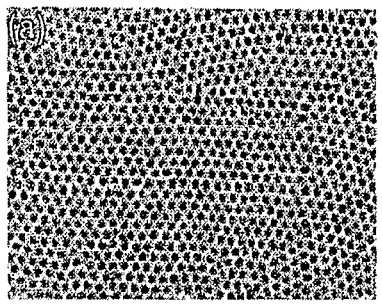
FIGS. 6 to 8 shows examples of anodized aluminum.
Figure 7:
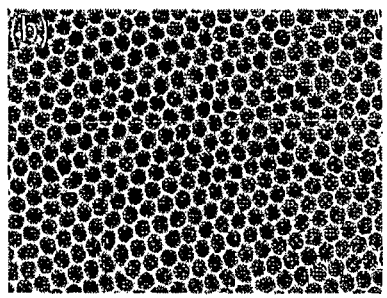
Figure 8:
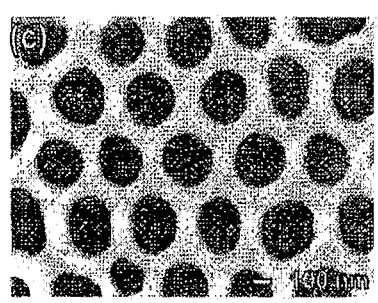

FIGS. 6, 7 and 8 show SEM micrographs of the bottom view of anodic alumina layers [2]. Anodization was conducted as follows:
  For FIG. 6: 0.3 M (1.7 wt %) sulphuric acid at 10° C. at 25 V,
  For FIG. 7: 0.3 M (2.7 wt %) oxalic acid at 1° C. at 40 V and
  For FIG. 8: 10-wt % phosphoric acid at 3° C. at 160 V.

Pore opening was carried out in 5-wt % phosphoric acid at 30° C. for 30 min (a), 35° C. for 30 min (b), and 45° C. for 30 min. The thickness of the oxide films was approximately 120 µm.

Aluminum anodization process conditions can be optimized for a given electrolyte, such as anodizing voltage and temperature, and acid concentration. Synthesis of porous aluminum membranes can start from a sputter-deposited Al film. An adequate anodizing process allows the synthesis of thin porous alumina membranes that can be used as porous encapsulation layers for MEMS packaging. Anodizing thin films with a thickness of two-six micrometers can be followed by careful opening of the backside through-hole pore morphology. The main anodizing parameters to be selected are type of the electrolyte since this affects diameter of the pores and the inter-pore distance, voltage and temperature, and sequence of anodizing steps.

Figure 9:
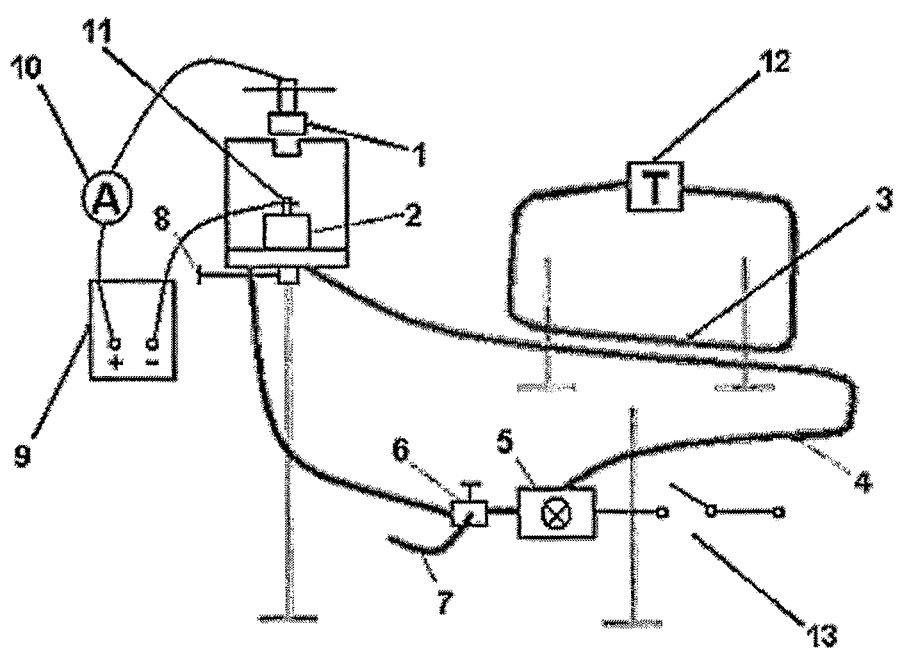
FIG. 9 shows a schematic view of equipment for anodizing.

Another example of aluminum anodizing in sulphuric acid for MEMS packaging applications will now be described. Alumina membranes are fabricated through a one-step anodization process. Aluminum layers (2-10 µm thick) are deposited by a sputtering process performed at low temperature. Prior to anodizing, the pieces are cleaned by placing them in an ultrasonic bath of deionized water for five minutes. This step is repeated once with acetone and again with deionized water for five more minutes. The samples are then dried. The surface and all the edges of the aluminum film are coated with a photoresist. This coating acts as a protective layer against anodization. Anodization occurs within a glass chamber in which one stainless steel clamp is suspended above. An overflow cell equipped with a pump system and a cooling unit was used (see FIG. 9). Reference numbers in FIG. 9 indicate the following:

1 Aluminum layer
2 Fountain
3 Cooling unit
4 Tube
5 Pump
6 Branch pipe
7 Tube flowing out
8 Valve controlling flowing rate
9 Power supplier
10 Ampere meter
11 Pt-grid counter electrode
12 Thermostat
13 Switch A platinum grid is used as a cathode (Pt-grid). The distance between the Pt-grid counter electrode and the aluminum is kept at 4 cm. The anode and the cathode are suspended in a sulphuric acid solution which acts as an electrolyte and is continuously cooled with a cooling unit throughout the process. Anodizing is conducted at a constant cell potential in a 20 wt. % sulfuric acid ($H_2SO_4$) electrolyte.

Figure 10:
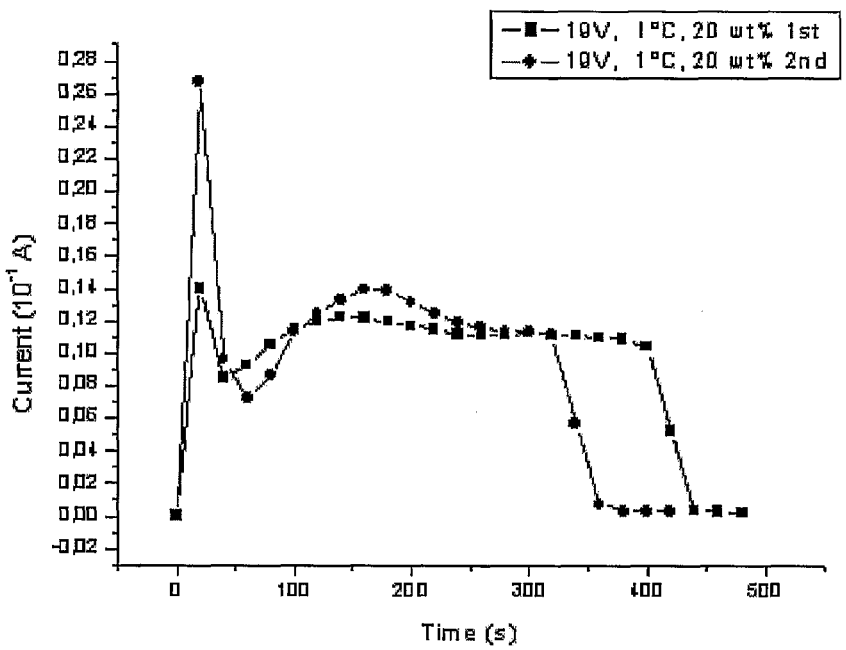
FIG. 10 shows current flow during anodizing

The anodizing process is going on until the current drops dramatically, the so-called turning time (i.e. all the aluminum is exhausted, FIG. 10). FIG. 10 shows current-time curves for two anodization experiments carried out at the same experimental conditions (19V, 1° C. and 20 wt % $H_2SO_4$) on a 2 µm thick aluminum layer.

Figure 11:
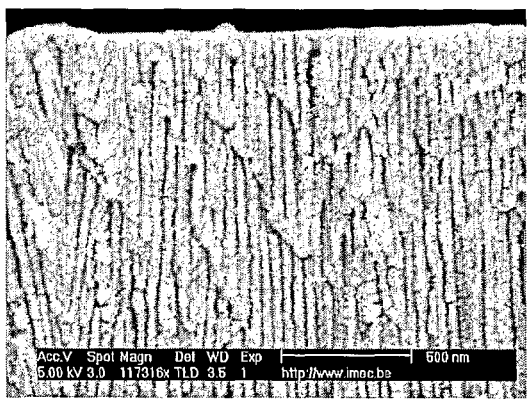
FIGS. 11 and 12 show cross section and top views of anodized Al
Figure 12:
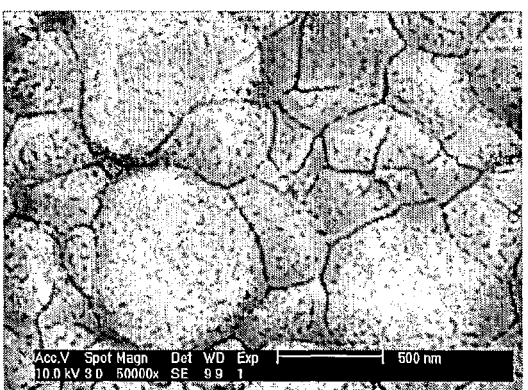

The final step is to remove the oxide barrier layer of the alumina ($Al_2O_3$) that remains after anodization has been fully completed. The $Al_2O_3$ barrier layer can be either removed by wet etching in a 5 wt. % $H_3PO_4$ acid solution or by chlorine based plasma. The porous structure of the alumina membranes is imaged using scanning electron microscope (SEM). For this, alumina, as with other non conductive surfaces, is sputter-coated with a thin gold layer (100 nm) to minimize the negative charge accumulation on the sample surface. FIGS. 11 and 12 show Cross-section and top-SEM images respectively of the porous structure of a 2 µm thick aluminum layer after anodization (19V, 1° C. and 20 wt % $H_2SO_4$).

Electrophoretic Deposition

Figure 13:
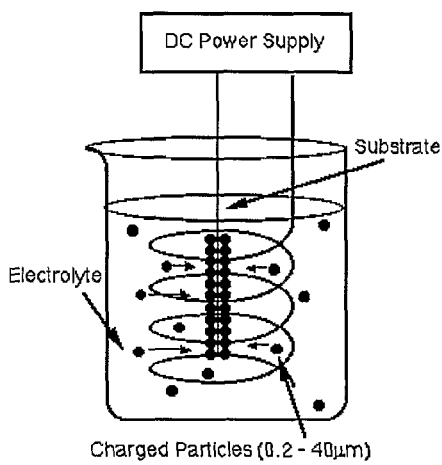
FIGS. 13 and 14 show apparatus for electrodeposition
Figure 14:
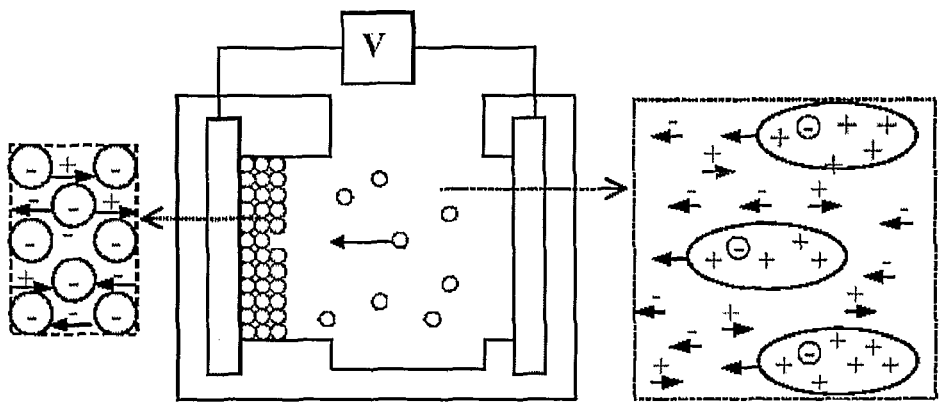

A process called electrophoretic deposition can also be used to fabricate porous films. The deposition technique can use a two-step process in which particles suspended in a liquid are forced to move towards one of the electrodes by applying an electric field to the suspension (see FIGS. 13 and 14) [4]. In a second step, the particles collect at one of the electrodes and form a coherent deposit on it. The deposited particles are then heated to fuse them together. This deposit will act as a mold in which electrodeposition of the membrane material can take place.

Because of its simplicity and versatility electrophoretic deposition has some advantages for porous membranes fabrication. The density of the sintered body can be changed by using different powders, which have different grain sizes and sintering temperatures [5] (see FIG. 14). Moreover, electrophoretic deposition is a low cost and rapid shaping process [4]. Also the powder can be deposited on an electrode of almost any shape and size and the deposit follows the shape imposed by this electrode.

The suspended particles will only move as a response of the applied electric field if they carry a charge. Four mechanisms have been identified by which the particles can be charged: selective adsorption of ions on the solid particle from the liquid, dissociation of ions from the solid phase into the liquid, adsorption or orientation of dipolar molecules on the particle surface and electron transfer between the solid and liquid phase due to difference in work function.

Figure 15:
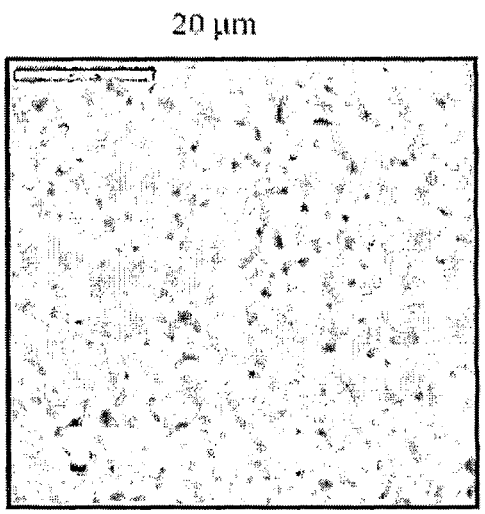
FIGS. 15 and 16 show SEM pictures of porous body by EPD after sintering 1200° C.
Figure 16:
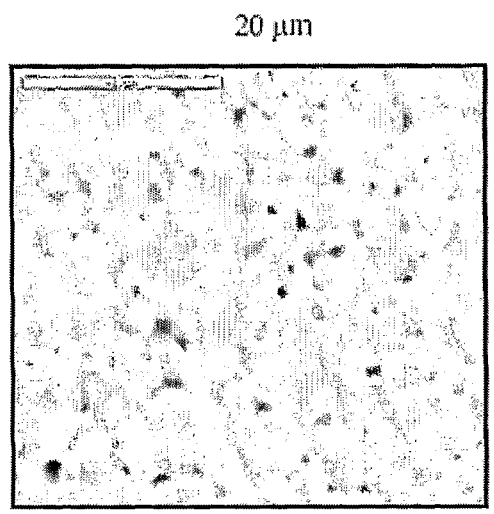

FIGS. 15 and 16 show SEM pictures of porous body by EPD after sintering 1200° C. for two hours [5]. For MEMS packaging application, the porous membrane would be made in a three-step process. First a layer of polymer particles will be deposited by electrophoretic deposition. Next the deposited particles are heated slightly to fuse them together. Subsequently, metal is electrodeposited through this layer. Further, to obtain a metal coating with microporosities, a selective etching with for example an oxygen plasma will be necessary in order to remove the polymer particles. The microporosities are thus defined by the polymer particles (the size of the pores is determined by the size of the particles). Particles can be obtained commercially in sizes that range from tens of nanometer to micrometers.

Therefore a porous membrane could be grown and release of the MEMS device could be carried out. However, the mechanical properties of the obtained metal membrane are uncertain. Also, the fusing temperatures currently reported are higher than other methods and risk damage to the MEMS structures unless polymer particles with a lower fusing temperature (<300° C.) can be found.

Electrochemical Dealloying

Porous thin films can finally also be fabricated by using a dealloying process in some binary alloy systems. Electrochemical dealloying, can be used for selective dissolution of material A in a binary alloy of composition $A_pB_{1-p}$, where A is the less noble (more electroactive) component.

Systems that form porosity upon dealloying share a number of characteristics. There are four basic shared characteristics that an alloy typically possesses if it has a chance of becoming nanoporous during dealloying: (i) the difference in potential $\Delta^\Phi$ required to dissolve the alloy component in its pure form must be separated by a few hundred millivolts. One element is thus more noble and the other is less noble; (ii) the composition is usually rich in the less noble component (although this is true for the Au-rich alloys, α-brass may be dealloyed of Zn up to 38 atom % Zn and is a notable exception); (iii) the alloy must be homogeneous with no phase separation prior to dissolution. Porosity evolution thus forms dynamically during dissolution and is not due to one phase simply being excavated out of a two-phase material; (iv) diffusion of more noble atoms at the alloy/electrolyte interface must be sufficiently fast. Alloys that share these characteristics include alloys of gold with silver or copper and palladium with silver or copper, there are many others.

Selective removal of one phase from the bulk of these composite materials will release a nanostructured layer [6]. The size of the pores is determined by the alloy composition and by both fluid and surface transport.

Figure 17:
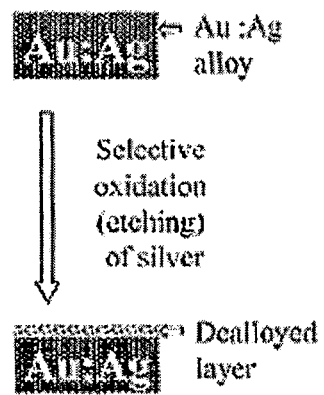
FIG. 17 shows dealloying of Au:Ag composite films.

FIG. 17 shows dealloying of Au:Ag composite films [6]

The selective dissolution of one element in a binary alloy can often leave behind a porous metal "sponge" with a tunnel structure that is completely interconnected and random in direction. These structures develop as long as the composition of the dissolving element is greater than a critical composition and its rate of removal is sufficiently rapid, though the physical processes that control the formation of these structures are not Li and Sieradzki have previously used this technology to prepare bulk samples of nanoporous gold that, depending on the annealing regime, exhibited pore distributions in the range of 10-1000 nm.

Figure 18:
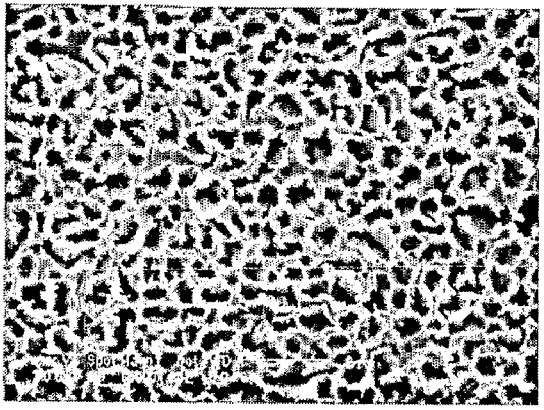
FIGS. 18 and 19 show a cross sectional view and plan view respectively of porous Ni thin film.
Figure 19:
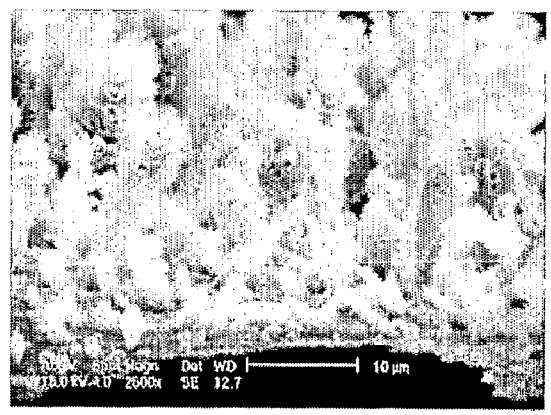
Figure 20:
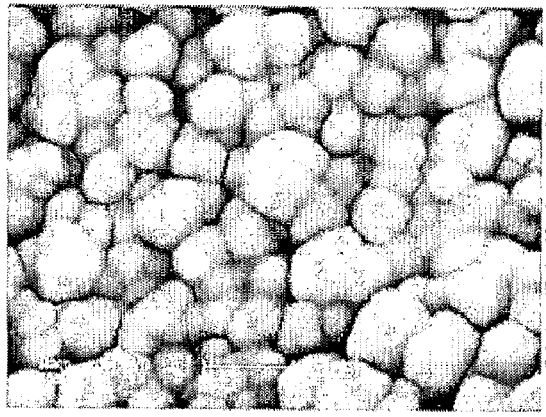
FIGS. 20 and 21 show SEM images of dealloyed Pt and electrodeposited PtCu alloy respectively.
Figure 21:
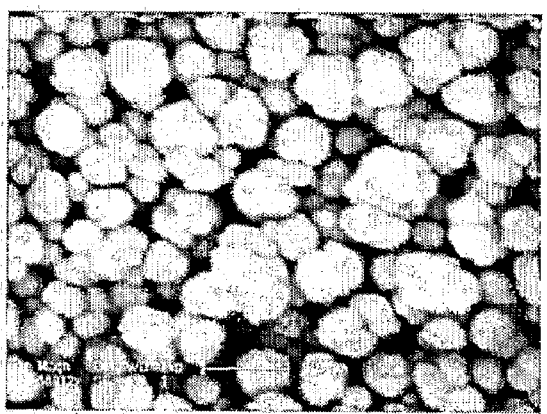

Of interest for MEMS packaging applications amongst others is the electrochemical dealloying reported to produce porous Ni thin film (FIGS. 18 and 19 show a cross sectional view and plan view respectively of porous Ni thin film [7]) by electrochemical dealloying of Cu from electrochemically prepared Ni/Cu alloy films [7]. Also the formation of porous Pt as shown in the SEM images of electrodeposited PtCu alloys and dealloyed porous platinum films (see FIGS. 20 and 21) can find applications for MEMS packaging [42]. FIGS. 20 and 21 show SEM images of dealloyed Pt [8] and electrodeposited PtCu alloy respectively.

Concluding Remarks:

MEMS packaging often plays the dominant role in determining the cost, reliability, and accuracy of the completed MEMS. Materials, design, encapsulation processes, assembly methods, environmental concerns and functionality are the major challenges facing effective packaging solutions. Major limitations of current MEMS packaging technology include a lack of standards or standardized packaging methods.

To achieve the benefits of plastic packaging and low temperature processing while avoiding the drawbacks of wafer-on-wafer capping, Low-Temperature thin film packaging technology was developed. In this process a patterned photoresist acts as a mold for a thin nickel electrodeposited membrane with the proper mechanical properties (high E, high yield stress and strength, and low tensile stress). Encapsulating MEMS devices with a porous membrane as described would facilitate the manufacturing of the device and reduce costs, as it avoids the need to shape the access holes of the membrane using photolithography because the device could be released through the porous membrane. The mechanical properties of the obtained porous membrane are not yet fully known. But since a porous membrane could be sealed with a strong material, the mechanical properties of the porous membrane may not be critical to the lifetime of the device.

Electrophoretic deposition currently has the disadvantage of the high bulk sintering treatment. Anodization of an Al film has the advantage of leaving a strong membrane (mainly Al-oxide with E=380 GPa, higher than the currently used Ni with E=200 GPa) even when porous. When made of aluminum oxide, the membrane is insulating. The pores here can be straight. The choice of pore size may depend on the sacrificial etch of the layer under the membrane and the sealing process.

Figure 22:
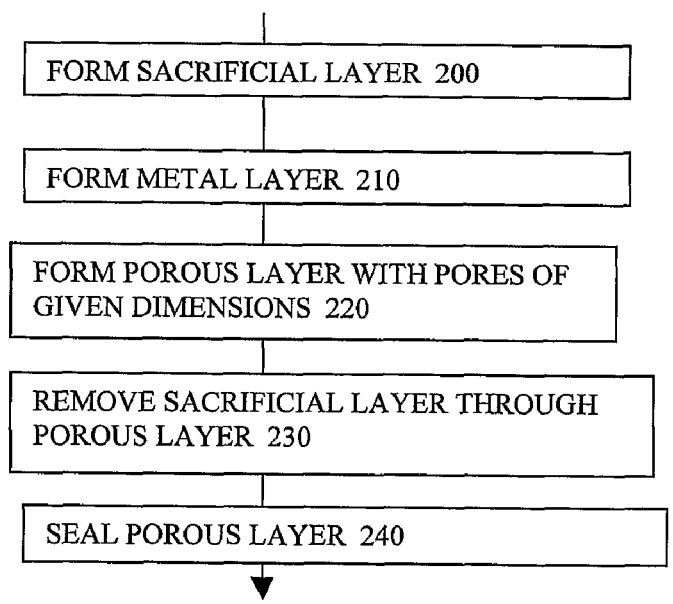
FIG. 22 shows steps in manufacturing according to an embodiment.

Synthesis of porous alumina membranes can start from a 2 μm sputter-deposited Al film, or thicker anodized layers can be used as part of a process flow (including sacrificial etch and sealing) for MEMS packaging with alumina porous membrane. As summarized in FIG. 22, a first step is forming a sacrificial layer at step 200, and forming a metal layer at step 210. This is used to form the metallic porous layer at step 220. The sacrificial layer is removed through the porous layer at step 230. The porous layer is then sealed at step 240 to encapsulate the cavity left by the sacrificial layer.

Other variations can be conceived and many other features added, within the claims.

REFERENCES

[1] B Das et al, *Semicond. Sci. Technol.* 14, pp. 988-993 (1999)
[2] A. P. Li, F. Muller, A. Birner, K. Nielsch and U. Gosele, J. Applied Physics 84, issue 11, 6023-6026 (1998)
[3] http://www.mtm.kuleuven.ac.be/Research/SURF/webgs.htm
[4] S. Put, J. Vleugels and O. Van der Biest, P/M Science and Technology Briefs, Vol. 3, no. 3, 14-17 (2001)
[5] F. Tang, T. Uchikoshi and Y. Sakka, J. American Ceramic Soc., vol. 85, no 9, 2161-2165(5) (2002)
[6] http://www.public.asu.edu/~karls/Corrosion.html
[7] K. Sieradzki, J. Electrochem. Soc. 140, 2868 (1993)
[8] C. Ji and P. C. Searson, Appl. Materials Letters, 23, 81 (2002)

The invention claimed is:

1. A method of manufacturing a semiconductor device having the steps of:
   forming a sacrificial layer where a micro cavity is to be located;
   forming a metal layer of thickness greater than 1 micron over the sacrificial layer;
   forming a porous layer from the metal layer, the porous layer having pores of length greater than ten times their breadth, and having a breadth in the range of 10-500 nanometers;
   wherein the metal layer comprises an alloy of metals having differing etch rates, and the step of forming the porous layer comprises etching the deposited alloy to remove the metal having the faster etch rate;
   removing at least some of the sacrificial layer through the porous layer, to form the micro cavity; and
   sealing the pores.

2. The method of claim 1, the etching step comprising any one or more of: electrochemical etching and chemical etching using an oxidizer and chelator diluted in a supercritical fluid.

3. The method of claim 1, the pores extending indirectly through the porous layer via junctions or curves.

4. The method of claim 1, the step of sealing having the step of forming a sealing layer over the porous layer.

5. The method of claim 1, to form a semiconductor device comprising any of a MEMS or NEMS device, a micro accelerometer, a micro gyroscope, micro tube, vibration micro sensor, micro mirror, micro mechanical resonator, resonant strain gauges, micro mechanical filter, micro switch, micro electrical circuit, micro relay, and an integrated circuit with air gap.

* * * * *